(12) United States Patent
Park et al.

(10) Patent No.: US 10,421,857 B2
(45) Date of Patent: Sep. 24, 2019

(54) PHOTOCURABLE COMPOSITION AND PATTERNED BODY MANUFACTURED BY USING THE COMPOSITION

(71) Applicant: Samsung Display Co., Ltd., Yongin-si (KR)

(72) Inventors: Jiyun Park, Yongin-si (KR); Jaehong Park, Yongin-si (KR); Sanghee Yu, Yongin-si (KR); Hyungguen Yoon, Yongin-si (KR); Kyunghee Lee, Yongin-si (KR); Kyungseon Tak, Yongin-si (KR); Minhyuck Kang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 85 days.

(21) Appl. No.: 15/869,882

(22) Filed: Jan. 12, 2018

(65) Prior Publication Data
US 2018/0298182 A1    Oct. 18, 2018

(30) Foreign Application Priority Data

Apr. 12, 2017 (KR) .................. 10-2017-0047590

(51) Int. Cl.
| | |
|---|---|
| *C08L 33/16* | (2006.01) |
| *C08L 33/10* | (2006.01) |
| *C08L 33/08* | (2006.01) |
| *C08J 3/24* | (2006.01) |
| *C08J 3/28* | (2006.01) |
| *C09D 4/06* | (2006.01) |
| *C08F 220/22* | (2006.01) |

(Continued)

(52) U.S. Cl.
CPC ............ *C08L 33/16* (2013.01); *C08F 220/22* (2013.01); *C08J 3/24* (2013.01); *C08J 3/28* (2013.01); *C08L 33/08* (2013.01); *C08L 33/10* (2013.01); *C09D 4/06* (2013.01); *G03F 7/0002* (2013.01); *G03F 7/0027* (2013.01); *G03F 7/0046* (2013.01); *C08F 2500/17* (2013.01); *C08F 2800/20* (2013.01)

(58) Field of Classification Search
CPC .......... C08L 33/16; C08L 33/08; C08L 33/10; C08F 220/22; C08F 2500/17; C08F 2800/20; C08J 3/24; C08J 3/28; G03F 7/0002; G03F 7/0027; G03F 7/0046
USPC ........................................... 526/245
See application file for complete search history.

(56) References Cited

U.S. PATENT DOCUMENTS

| | | | |
|---|---|---|---|
| 9,335,628 | B2 | 5/2016 | Kodama |
| 2003/0207215 | A1* | 11/2003 | Xu ........................ C08F 22/18 430/321 |

(Continued)

FOREIGN PATENT DOCUMENTS

| | | |
|---|---|---|
| JP | 2009-543340 | 12/2009 |
| KR | 10-2004-0006591 | 1/2004 |

(Continued)

*Primary Examiner* — William K Cheung
(74) *Attorney, Agent, or Firm* — H.C. Park & Associates, PLC (57) ABSTRACT

A photocurable composition including a fluorine-based polymeric monomer, a (meth)acrylate monomer, and a photoinitiator. An amount of the fluorine-based polymeric monomer is in a range of about 20 parts to less than 40 parts by weight based on 100 parts by weight of the photocurable composition.

20 Claims, 6 Drawing Sheets

(51) Int. Cl.
    *G03F 7/00*     (2006.01)
    *G03F 7/004*    (2006.01)

(56) References Cited

U.S. PATENT DOCUMENTS

| | | |
|---|---|---|
| 2004/0127632 A1 | 7/2004 | Kim et al. |
| 2007/0173592 A1 | 7/2007 | Kim et al. |
| 2008/0000373 A1 | 1/2008 | Petrucci-Samija et al. |

FOREIGN PATENT DOCUMENTS

| | | |
|---|---|---|
| KR | 10-2009-0068490 | 6/2009 |
| KR | 10-2012-0079094 | 7/2012 |

\* cited by examiner

| I/J Drop 10pL | 30sec | 60sec | 90sec | 120sec | 180sec |
|---|---|---|---|---|---|
| COMPARATIVE EXAMPLE COMPOSITION 1 | | | | | |
| COMPARATIVE EXAMPLE COMPOSITION 3 | | | | | |

PHOTOCURABLE COMPOSITION AND PATTERNED BODY MANUFACTURED BY USING THE COMPOSITION

CROSS-REFERENCE TO RELATED APPLICATION

This application claims priority from and the benefit of Korean Patent Application No. 10-2017-0047590, filed on Apr. 12, 2017, which is hereby incorporated by reference for all purposes as if fully set forth herein.

BACKGROUND

Field

Exemplary embodiments relate to a photocurable composition and a patterned body manufactured by using the composition.

Discussion of the Background

In line with miniaturization of electronic products such as display devices in recent years, methods for forming fine patterns used in these devices have been studied from various perspectives.

Nanoimprint lithography is a method of etching a pattern on a substrate using an imprinting resin having a fine pattern as a mask. Nanoimprint lithography does not require process conditions such as high temperature or high pressure, and thus is suitable for mass production and may be used to form fine patterns by a simple process using a polymer.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a photocurable composition and a patterned body manufactured by using the composition.

Additional aspects will be set forth in the detailed description which follows, and, in part, will be apparent from the disclosure, or may be learned by practice of the inventive concept.

According to exemplary embodiments, a photocurable composition includes a fluorine-based polymeric monomer; a (meth)acrylate monomer; and a photoinitiator, wherein an amount of the fluorine-based polymeric monomer is in a range of about 20 parts to less than 40 parts by weight, based on 100 parts by weight of the photocurable composition.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

As used herein, "fluorine-based polymeric monomer" may include one type of fluorine-based polymeric monomer or a mixture of at least two types of fluorine-based polymeric monomer. Also, "(meth)acrylate monomer" may include one type of (meth)acrylate monomer or a mixture of at least two types of (meth)acrylate monomer, and "photoinitiator" may include one type of photoinitiator or a mixture of at least two types of photoinitiator.

The term "(meth)acrylate monomer" denotes a monomer including an acrylate functional group or a monomer including a methacrylate functional group.

The term "monofunctional (meth)acrylate" denotes a (meth)acrylate monomer that includes one acrylate functional group or (meth)acrylate monomer.

The term "difunctional (meth)acrylate" denotes a (meth)acrylate monomer that includes two acrylate functional groups or (meth)acrylate monomers.

The term "multifunctional (meth)acrylate" denotes a (meth)acrylate monomer that includes at least two or at least three acrylate functional groups or (meth)acrylate monomers, and the term "multifunctional (meth)acrylate including at least three functional groups" denotes a (meth)acrylate monomer including at least three acrylate functional groups or (meth)acrylate monomers.

The term "tetrafunctional (meth)acrylate" denotes a (meth)acrylate monomer that includes four acrylate functional groups or (meth)acrylate monomers.

The term "hexafunctional (meth)acrylate" denotes a (meth)acrylate monomer that includes six acrylate functional groups or (meth)acrylate monomers.

According to an embodiment, a photocurable composition includes a fluorine-based polymeric monomer; a (meth)acrylate monomer; and a photoinitiator, wherein an amount of the fluorine-based polymeric monomer is in a range of about 20 parts to less than 40 parts by weight based on 100 parts by weight of the photocurable composition. In some embodiments, an amount of the fluorine-based polymeric monomer may be in a range of about 22.5 parts to about 37.5 parts by weight, for example, about 24 parts to about 36 parts by weight, or, for example, about 25 parts to about 35 parts by weight based on 100 parts by weight of the photocurable composition.

When the amount of the fluorine-based polymeric monomer is within these ranges, the photocurable composition may have an excellent releasing force and sufficient spreadability, and thus may have excellent physical properties after a curing process. When the amount of the fluorine-based polymeric monomer is less than 20 parts by weight, surface tension of the composition decreases, which results in a decrease in the releasability after the curing process, and thus a patterned body may not be repeatedly used. When the amount of the fluorine-based polymeric monomer is 40 parts by weight or greater, water repellency and oil repellency may be excessively high, which may result in deterioration of substrate spreadability.

In one embodiment, the fluorine-based polymeric monomer may include a fluorine-containing (meth)acrylate. For example, in the fluorine-containing (meth)acrylate, at least one hydrogen atom included in the (meth)acrylate may be substituted with a fluorine atom.

In another embodiment, the fluorine-based polymeric monomer may include a fluorine-containing difunctional (meth)acrylate. The fluorine-containing difunctional (meth)acrylate not only has characteristics of water repellency and oil repellency as a fluorine-based polymeric monomer, but also has improved surface-curing properties and surface durability, compared to when a monofunctional (meth)acrylate is used.

In another embodiment, the fluorine-based polymeric monomer may include an acrylate represented by Formula 1:

Formula 1 wherein, in Formula 1,
$X_1$ is a single bond, O, S, —C(=O)—, or $C(R_{11})(R_{12})$,
$Y_1$ and $Y_2$ are each independently a single bond, O, S, or $C(R_{13})(R_{14})$,
$R_{f1}$ and $R_{f2}$ are each independently a $C_1$-$C_{20}$ hydrocarbon group including a fluorine atom,
$R_1$, $R_2$, $R_3$, $R_4$, $R_5$, $R_6$, $R_{11}$, $R_{12}$, $R_{13}$, and $R_{14}$ are each independently selected from:
hydrogen, deuterium, —F, —Cl, —Br, —I, a $C_1$-$C_{20}$ alkyl group, a $C_2$-$C_{20}$ alkenyl group, a $C_2$-$C_{20}$ alkynyl group, and a $C_1$-$C_{20}$ alkoxy group; and
a $C_1$-$C_{20}$ alkyl group, a $C_2$-$C_{20}$ alkenyl group, a $C_2$-$C_{20}$ alkynyl group, and a $C_1$-$C_{20}$ alkoxy group, each substituted with at least one selected from deuterium, —F, —Cl, —Br, —I, a hydroxyl group, a cyano group, an epoxy group, a nitro group, an amidino group, a hydrazino group, a hydrazono group, a $C_1$-$C_{20}$ alkyl group, and a $C_1$-$C_{20}$ alkoxy group, and
m1 is an integer selected from 1 to 10.

In one embodiment, in Formula 1, $R_{f1}$ and $R_{f2}$ are identical to each other and may each be a $C_1$-$C_{20}$ hydrocarbon group saturated with fluorine.

In one embodiment, the fluorine-based polymeric monomer may include an acrylate represented by Formula 1-1:

Formula 1-1

In one embodiment, an amount of the fluorine-based polymeric monomer may be in a range of about 25 parts to about 35 parts by weight based on 100 parts by weight of the photocurable composition.

In one embodiment, an amount of the (meth)acrylate monomer may be in a range of about 30 parts to about 70 parts by weight based on 100 parts by weight of the photocurable composition.

In one embodiment, the (meth)acrylate monomer may include a multifunctional (meth)acrylate monomer including at least three functional groups and a monofunctional (meth)acrylate monomer.

In one embodiment, the multifunctional (meth)acrylate monomer including at least three functional groups may include pentaerythritol tri(meth)acrylate, pentaerythritol tetra(meth)acrylate, pentaerythritol hexa(meth)acrylate, dipentaerythritol tri(meth)acrylate, dipentaerythritol penta(meth)acrylate, dipentaerythritol hexa(meth)acrylate, trimethylolpropane tri(meth)acrylate, tris(meth)acryloyloxyethyl phosphate, ethoxylated trimethylolpropane tri(meth)acrylate, ethoxylated pentaerythritol tetra(meth)acylate, ethoxylated glycerol tri(meth)acryalte, phosphine oxide (PO) modified glycerol tri(meth)acrylate, pentaerythritol tri(meth)acrylate, ethoxylated phosphoric acid triacrylate, trimethyloylpropane tri(meth)acryalte, caprolactone modified trimethylolpropane tri(meth)acrylate, ethoxylated trimethylolpropane tri(meth)acrylate, PO modified trimethylolpropane tri(meth)acrylate, tris(acryloxyethyl)isocyanurate, dipentaerythritolhexa(meth)acrylate, caprolactone modified dipentaerythritol hexa(meth)acrylate, dipentaerythritol hydroxypenta(meth)acrylate, alkyl modified dipentaerythritol penta(meth)acrylate, dipentaerythritol poly(meth)acrylate, alkyl modified dipentaerythritoltri(meth)acrylate, or a combination thereof.

In another embodiment, the multifunctional (meth)acrylate monomer including at least three functional groups may include a multifunctional (meth)acrylate monomer including at least four functional groups.

In another embodiment, the multifunctional (meth)acrylate monomer including at least three functional groups may include pentaerythritol tetra(meth)acrylate, pentaerythritol hexa(meth)acrylate, dipentaerythritol penta(meth)acrylate, dipentaerythritol hexa(meth)acrylate, ethoxylated pentaerythritol tetra(meth)acrylate, caprolactone modified dipentaerythritol hexa(meth)acrylate, dipentaerythritol hydroxy penta(meth)acrylate, alkyl modified dipentaerythritol penta(meth)acrylate, or a combination thereof.

In another embodiment, the multifunctional (meth)acrylate monomer including at least three functional groups may include a tetrafunctional (meth)acrylate or a hexafunctional (meth)acrylate.

In another embodiment, multifunctional (meth)acrylate monomer including at least three functional groups may include pentaerythritol tetra(meth)acrylate, dipentaerythritol tetra(meth)acrylate, ethoxylated pentaerythritol tetra(meth)acrylate, ethoxylated dipentaerythritol tetra(meth)acrylate, pentaerythritol hexa(meth)acrylate, dipentaerythritol hexa(meth)acrylate, or a combination thereof.

In one embodiment, the monofunctional (meth)acrylate may include methyl (meth)acrylate, ethyl (meth)acrylate, n-propyl (meth)acrylate, isopropyl (meth)acrylate, n-butyl (meth)acrylate, isoamyl (meth)acrylate, isobutyl (meth)acrylate, isooctyl (meth)acrylate, sec-butyl (meth)acrylate, t-butyl (meth)acrylate, n-pentyl (meth)acrylate, 3-methylbutyl (meth)acrylate, n-hexyl (meth)acrylate, 2-ethyl-n-hexyl (meth)acrylate, n-octyl (meth)acrylate, cyclohexyl (meth)acrylate, isobornyl (meth)acrylate, dicyclopentanyl(meth)acrylate, dicyclopentanyloxyethyl (meth)acrylate, isomyristyl (meth)acrylate, lauryl (meth)acrylate, methoxydipropyleneglycol (meth)acrylate, methoxytripropyleneglycol (meth)acrylate, benzyl (meth)acrylate, 2-hydroxyethyl (meth)acrylate, 2-hydroxypropyl (meth)acrylate, 3-hydroxypropyl (meth)acrylate, 4-hydroxybutyl (meth)acrylate, 5-hydroxypentyl (meth)acrylate, 6-hydroxyhexyl (meth)acrylate, 4-hydroxycyclohexyl (meth)acrylate, neopentylglycol mono(meth)acrylate, 3-chloro-2-hydroxypropyl (meth)acrylate, 1,1-dimethyl-3-oxobutyl (meth)acrylate, 2-acetoacetoxyethyl (meth)acrylate, 2-methoxyethyl (meth)acrylate, 2-ethoxyethyl (meth)acrylate, neopentylglycol mono(meth)acrylate, ethyleneglycol monomethylether (meth)acrylate, glycerin mono(meth)acrylate, 2-acryloyloxyethyl phthalate, 2-acryloyloxy 2-hydroxyethyl phthalate, 2-acryloyloxyethyl hexahydrophthalate, 2-acryloyloxy propylphthalate, neopentylglycolbenzoate (meth)acrylate, nonylpenoxypolyethyleneglycol (meth)acrylate, nonylpenoxypolypropyleneglycol (meth)acrylate, para-cumylphenoxyethyleneglycol (meth)acrylate, ECH modified phenoxy acrylate, phenoxyethyl (meth)acrylate, phenoxydiethyleneglycol (meth)acrylate, phenoxyhexaethyleneglycol (meth)acrylate, phenoxytetraethyleneglycol (meth)acrylate, polyethyleneglycol (meth)acrylate, polyethylene glycol phenylether (meth)acrylate, polyethyleneglycol-polypropyleneglycol (meth)acrylate, polypropyleneglycol (meth)acrylate, stearyl (meth)acrylate, ethoxilated phenol acrylated (phenol EO acrylate), ethoxilated cresol (meth)acrylate, dipropyleneglycol (meth)acrylate, ethoxylated phenyl (meth)acrylate, EO modified succinic acid (meth)acrylate, tert-butyl (meth)acrylate, tribromophenyl (meth)acrylate, EO modified tribromophenyl (meth)acrylate, tridodecyl (meth)acrylate, tetrahydrofurfuryl (meth)acrylate, or a combination thereof.

In another embodiment, the monofunctional (meth)acrylate may include at least one selected from:
- a $C_5$-$C_{60}$ carbocyclic group and a $C_1$-$C_{60}$ heterocyclic group; and
- a $C_5$-$C_{60}$ carbocyclic group and a $C_1$-$C_{60}$ heterocyclic group, each substituted with at least one selected from deuterium, —F, —Cl, —Br, —I, a hydroxyl group, a cyano group, an epoxy group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{20}$ aryl group, and a $C_2$-$C_{20}$ heteroaryl group.

In another embodiment, the monofunctional (meth)acrylate may include polyethylene glycol phenylether (meth)acrylate, ethoxylated phenol (meth)acrylate benzyl (meth)acrylate, tetrahydrofurfuryl (meth)acrylate, or a combination thereof.

In one embodiment, an amount of the multifunctional (meth)acrylate including at least three functional groups may be in a range of about 1 part to about 20 parts by weight based on 100 parts by weight of the photocurable composition, and an amount of the multifunctional (meth)acrylate including at least three functional groups may be in a range of about 10 parts to about 60 parts by weight based on 100 parts by weight of the photocurable composition.

In one embodiment, an amount of the multifunctional (meth)acrylate including at least three functional groups may be in a range of about 1 part to about 10 parts, or, for example, about 2 parts to about 6 parts by weight based on 100 parts by weight of the photocurable composition. The multifunctional (meth)acrylate including at least three functional groups increases a degree of curing and a degree of cross-linking while curing the composition. When the amount of the multifunctional (meth)acrylate including at least three functional groups is within these ranges, a degree of cross-linking may be sufficiently increased while maintaining viscosity of the composition at a low level.

In another embodiment, an amount of the monofunctional (meth)acrylate monomer may be in a range of about 25 parts to about 55 parts, for example, about 30 parts to about 35 parts, or, for example, about 30 parts by weight based on 100 parts by weight of the photocurable composition.

In one embodiment, the photocurable composition may further include a difunctional (meth)acrylate.

That is, the difunctional (meth)acrylate may be used together with the monofunctional (meth)acrylate. The difunctional (meth)acrylate also maintains viscosity of the whole composition, in addition to the monofunctional (meth)acrylate, and an amount of the difunctional (meth)acrylate may be controlled to control a degree of cross-linking.

In one embodiment, the difunctional (meth)acrylate monomer may include ethylene glycol di(meth)acrylate, diethylene glycol di(meth)acrylate, triethylene glycol di(meth)acrylate, propylene glycol di(meth)acrylate, dipropylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, dipentaerythritol di(meth)acrylate, or a combination thereof.

In another embodiment, the difunctional (meth)acrylate monomer may include ethylene glycol di(meth)acrylate, diethylene glycol di(meth)acrylate, triethylene glycol di(meth)acrylate, propylene glycol di(meth)acrylate, dipropylene glycol di(meth)acrylate, or a combination thereof.

In one embodiment, an amount of the difunctional (meth)acrylate may be in a range of about 10 parts to about 40 parts by weight based on 100 parts by weight of the photocurable composition. For example, an amount of the difunctional (meth)acrylate may be in a range of about 20 parts to about 30 parts by weight based on 100 parts by weight of the photocurable composition.

In one embodiment, the total amount of the monofunctional (meth)acrylate and the difunctional (meth)acrylate monomer may be in a range of about 30 parts to about 80 parts, or, for example, about 30 parts to about 70 parts by weight based on 100 parts by weight of the photocurable composition.

In one embodiment, the photocurable composition may further include a releasing additive including a fluorine atom or a silicon atom.

In some embodiments the releasing additive may include at least one polymeric functional group.

In one embodiment, an amount of the releasing additive may be in a range of about 0.5 parts to about 5 parts by weight based on 100 parts by weight of the photocurable composition. The photoinitiator is used to promote polymerization of a monomer and to improve a curing rate, and thus any known photoinitiator may be used. For example, the photoinitiator may be 1-hydroxy-cyclohexyl-phenyl-ketone, 2-hydroxy-2-methyl-1-phenyl-1-propanone, 2-hydroxy-1-[4-2-hydroxyethoxy)phenyl]-2-methyl-1-propanone, methylbenzoylformate, oxy-phenyl-acetic acid-2-[2-oxo-2-phenyl-acetoxy-ethoxy]-ethyl ester, oxy-phenyl-acetic acid-2-[2-hydroxy-ethoxy]-ethyl ester, alpha-dimethoxy-alpha-phenylacetophenone, 2-benzyl-2-(dimethylamino)-1-[4-4-morpholinylphenyl]-1-butanone, 2-methyl-1-[4-(methylthio)phenyl]-2-4-morpholinyl-1-propanone, diphenyl(2,4,6-trimethylbenzoyl)-phosphine oxide, phenyl bis 2,4,6-trimethyl benzoyl) phosphine oxide, or a combination thereof.

In one embodiment, the photoinitiator may be selected from a phenyl ketone-based compound, a phosphine oxide-based compound, and a combination thereof. For example, the photoinitiator may be 1-hydroxycyclohexyl phenyl ketone, phenyl bis 2,4,6-trimethylbenzoyl phosphine oxide, or a combination thereof. In another embodiment, a weight ratio of the phenyl ketone-based compound and the phosphine oxide-based compound may be in a range of about 0.8:1 to about 1:0.8.

In some embodiments, an amount of the photoinitiator may be in a range of about 0.1 parts to about 20 parts by weight, or, for example, about 1 part to about 10 parts by weight.

In one embodiment, the photocurable composition may further include an aryl phosphine-based compound. The aryl phosphine-based compound suppresses inhibition of polymerization caused by oxygen, and thus may improve polymer stability of the photocurable composition.

The aryl phosphine-based compound may be, for example, triphenyl phosphine.

In one embodiment, an amount of the aryl phosphine-based compound may be in a range of about 0.1 parts to about 10 parts by weight based on 100 parts by weight of the photocurable composition.

In one embodiment, a viscosity of the photocurable composition at 25° C. may be in a range of about 15 cps to about 20 cps.

In another embodiment, a surface tension of the photocurable composition at 25° C. may be in a range of about 25 mN/m to about 30 mN/m.

According to another embodiment, provided is a patterned body manufactured by using the photocurable composition.

In one embodiment, a releasing force of the patterned body may be in a range of about 0.001 kgf to about 0.05 kgf or, for example, about 0.03 kgf or less.

In another embodiment, a line width of the patterned body may be several nm to several hundreds of nm. In this regard, the patterned body may be manufactured with fine patterns having various dimensions and shapes while maintaining high releasability.

The term "$C_1$-$C_{60}$ alkyl group," as used herein, refers to a linear or branched aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group," as used herein, refers to a divalent group having the same structure as the $C_1$-$C_{60}$ alkyl group.

The term "$C_2$-$C_{60}$ alkenyl group," as used herein, refers to a hydrocarbon group formed by substituting at least one carbon-carbon double bond in the middle or at the terminal of the $C_2$-$C_{60}$ alkyl group, and examples thereof are an ethenyl group, a propenyl group, and a butenyl group. The term "$C_2$-$C_{60}$ alkenylene group," as used herein, refers to a divalent group having the same structure as the $C_2$-$C_{60}$ alkenyl group.

The term "$C_2$-$C_{60}$ alkynyl group," as used herein, refers to a hydrocarbon group formed by substituting at least one carbon-carbon triple bond in the middle or at the terminal of the $C_2$-$C_{60}$ alkyl group, and examples thereof are an ethynyl group and a propynyl group. The term "$C_2$-$C_{60}$ alkynylene group," as used herein, refers to a divalent group having the same structure as the $C_2$-$C_{60}$ alkynyl group.

The term "$C_1$-$C_{60}$ alkoxy group," as used herein, refers to a monovalent group represented by —O$A_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having the same structure as the $C_3$-$C_{10}$ cycloalkyl group.

The term "$C_1$-$C_{10}$ heterocycloalkyl group," as used herein, refers to a monovalent monocyclic group having at least one heteroatom selected from N, O, Si, P, and S as a ring-forming atom, and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one double bond in the ring thereof and does not have aromaticity, and examples thereof include a cyclopentenyl group, a cyclohexenyl group, and a cycloheptenyl group. The term "$C_3$-$C_{10}$ cycloalkenylene group," as used herein, refers to a divalent group having the same structure as the $C_3$-$C_{10}$ cycloalkenyl group.

The term "$C_1$-$C_{10}$ heterocycloalkenyl group," as used herein, refers to a monovalent monocyclic group that has at least one heteroatom selected from N, O, Si, P, and S as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group," as used herein, refers to a monovalent group having a carbocyclic aromatic system that has at least one heteroatom selected from N, O, Si, P, and S as a ring-forming atom, and 1 to 60 carbon atoms. The term "$C_1$-$C_{60}$ heteroarylene group," as used herein refers to a divalent group having a carbocyclic aromatic system that has at least one heteroatom selected from N, O, Si, P, and S as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_5$-$C_{60}$ carbocyclic group," as used herein, refers to a monocyclic or polycyclic group including carbon only as a ring-forming atom and having 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a ring such as benzene, a monovalent group such as a phenyl group, or a divalent group such as a phenylene group. Also, depending on the number of substituents connected to the $C_5$-$C_{60}$ carbocyclic group, the $C_5$-$C_{60}$ carbocyclic group may be varied as a trivalent group or a tetravalent group.

The term "$C_1$-$C_{60}$ heterocyclic group," as used herein, refers to a group having the same structure as the $C_5$-$C_{60}$ carbocyclic group and including at least one heteroatom selected from N, O, Si, P, and S as a ring-forming atom, in addition to carbon (C) (where the number of carbon atoms may be 1 to 60).

The term "$C_1$-$C_{20}$ hydrocarbon group," as used herein, refers to a group including a carbon atom and a hydrogen atom, and examples of the $C_1$-$C_{20}$ hydrocarbon group may include a $C_1$-$C_{20}$ alkyl group, a $C_1$-$C_{20}$ alkenyl group, a $C_1$-$C_{20}$ alkynyl group, a $C_3$-$C_{10}$ cycloalkyl group, or a $C_3$-$C_{10}$ cycloalkenyl group.

The term "$C_1$-$C_{20}$ hydrocarbon group including a fluorine atom," as used herein, refers to a group among $C_1$-$C_{20}$ hydrocarbon groups, in which some hydrogen atoms are substituted with fluorine atoms, and an example thereof may be a $C_1$-$C_{20}$ hydrocarbon group in which at least one hydrogen atom is substituted with a fluorine atom.

Also, the term "$C_1$-$C_{20}$ hydrocarbon group saturated with a fluorine atom," as used herein, refers to a group among $C_1$-$C_{20}$ hydrocarbon groups, in which all hydrogen atoms are substituted with fluorine atoms, and an example thereof may be a group including a $C_1$-$C_{20}$ fluorine alkyl group, a $C_1$-$C_{20}$ fluorine alkenyl group, or a $C_1$-$C_{20}$ fluorine alkynyl group.

Hereinafter, a compound and an organic light-emitting device according to one or more embodiments will be described in further detail with reference to Examples. The expression "B was used instead of A" used in describing Examples may refer to a molar equivalent of A being identical to a molar equivalent of B.

EXAMPLES

Evaluation Example 1: Evaluation of Viscosity and Surface Tension

Preparation of Example Composition 1 and Comparative Example Compositions 1 to 3

According to compositions shown in Table 1, Example Composition 1 and Comparative Example Compositions 1 to 3 were prepared. A compound represented by Formula 1-1 was used as a fluorine-based monomer.

Formula 1-1

Measurement of Viscosity and Surface Tension

Viscosities and surface tensions were measured by using a viscosity meter and a surface tension meter that are generally used in a lab under conditions including room temperature and atmospheric pressure. Details about the compositions used in evaluation are shown in Table 1.

TABLE 1

|  | | Example Composition 1 | Comparative Example Composition 1 | Comparative Example Composition 2 | Comparative Example Composition 3 |
|---|---|---|---|---|---|
| Composition (weight %) | Fluorine-based polymeric monomer | 25.0 | 50.0 | 40.0 | 50.0 |
| | Ethoxylated pentaerythritol tetraacrylate (SR494, available from SATOMER) | 0.5 | 3.0 | 4.0 | 6.0 |
| | Dipentaerythritol hexaacrylate (DPHA F, available from Miwon) | 0.5 | 2.0 | 3.0 | 4.0 |
| | Dipropylene glycol diacrylate (SR508, available from SATOMER) | 22.0 | 20.0 | 30.0 | 30.0 |
| | Polyethylene glycol ether acrylate (PEO4A, available from Miwon) | 50.0 | 20.0 | 18.0 | 5.0 |
| | 1-hydroxycyclohexyl phenyl ketone (Irgacure184, available from Sigma Aldrich) | 1.0 | 2.5 | 2.5 | 2.5 |
| | (Phenyl bis2,4,6-trimethylbenzoyl) phosphine oxide (Irgacure819, available from Sigma Aldrich) | 1.0 | 2.5 | 2.5 | 2.5 |
| Viscosity (cps) | | 17.7 | 18.2 | 16.0 | 16.7 |
| Surface tension (mN/m) | | 27.6 | 26.084 | 25.995 | 26.279 |

Evaluation Example 2: Evaluation of Hardness and Elastic Modulus

Example Composition 1 and Comparative Example Compositions 1 to 3 were coated at a thickness of 5 μm on glass coated with an adhesion promoter and cured to prepare samples, and hardnesses and elastic moduli of the samples were measured by using a nanohardness tester (Nanoindenter). An amount of energy for light exposure (intensity of light exposure) was varied during a curing process to perform curing, and a hardness and an elastic modulus were measured per curing energy. The results are shown in Table 2.

TABLE 2

| Composition | Intensity of light exposure (J) | Hardness (GPa) | Elastic modulus (GPa) |
|---|---|---|---|
| Example composition 1 | 2 | 0.020 ± 0.001 | 0.18 ± 0.00 |
| Comparative Example composition 1 | 0.5 | 0.068 ± 0.001 | 2.24 ± 0.02 |
| | 2 | 0.080 ± 0.001 | 2.57 ± 0.03 |
| | 6 | 0.091 ± 0.001 | 3.07 ± 0.03 |
| | 25 | 0.100 ± 0.003 | 2.82 ± 0.07 |
| Comparative Example composition 2 | 0.5 | 0.100 ± 0.002 | 2.93 ± 0.06 |
| | 2 | 0.103 ± 0.005 | 2.88 ± 0.09 |
| | 6 | 0.129 ± 0.002 | 3.43 ± 0.04 |
| | 25 | 0.142 ± 0.002 | 3.75 ± 0.02 |
| Comparative Example composition 3 | 0.5 | 0.160 ± 0.012 | 4.13 ± 0.08 |
| | 2 | 0.180 ± 0.002 | 4.31 ± 0.04 |
| | 6 | 0.163 ± 0.006 | 3.96 ± 0.12 |
| | 25 | 0.170 ± 0.002 | 4.22 ± 0.02 |

Referring to Table 2, it may be confirmed that the patterned body prepared by using Example Composition 1 had a hardness and an elastic modulus that were significantly lower as compared to those of the patterned bodies prepared by using Comparative Example Compositions 1 to 3.

Evaluation Example 3: Evaluation of Spreadability

Preparation of Example Composition 2

Example Composition 2 was prepared according to compositions shown in Table 3. A compound represented by Formula 1-1 was used as a fluorine-based polymeric monomer.

TABLE 3

| | Composition (weight %) Example Composition 2 |
|---|---|
| Fluorine-based polymeric monomer | 35.0 |
| Ethoxylated pentaerythritol tetraacrylate (SR494, available from SATOMER) | 3.0 |
| Dipentaerythritol hexaacrylate (DPHA F, available from Miwon) | 2.0 |
| Dipropylene glycol diacrylate (SR508, available from SATOMER) | 20.0 |
| Polyethyleneglycol phenyl ether acrylate (PEO4A, available from Miwon) | 35.0 |
| 1-hydroxycyclohexyl phenyl ketone (Irgacure184, available from Sigma Aldrich) | 2.5 |
| (Phenylbis2,4,6-trimethylbenzoyl)phosphine oxide (Irgacure819, available from Sigma Aldrich) | 2.5 |

Observation of Spreadability

Example Compositions 1 and 2 and Comparative Example Compositions 1 to 3 were inkjet printed on glass coated with an adhesion promoter, and degrees of spreadability thereof were observed through a microscope every 120 seconds.

Figure 1:
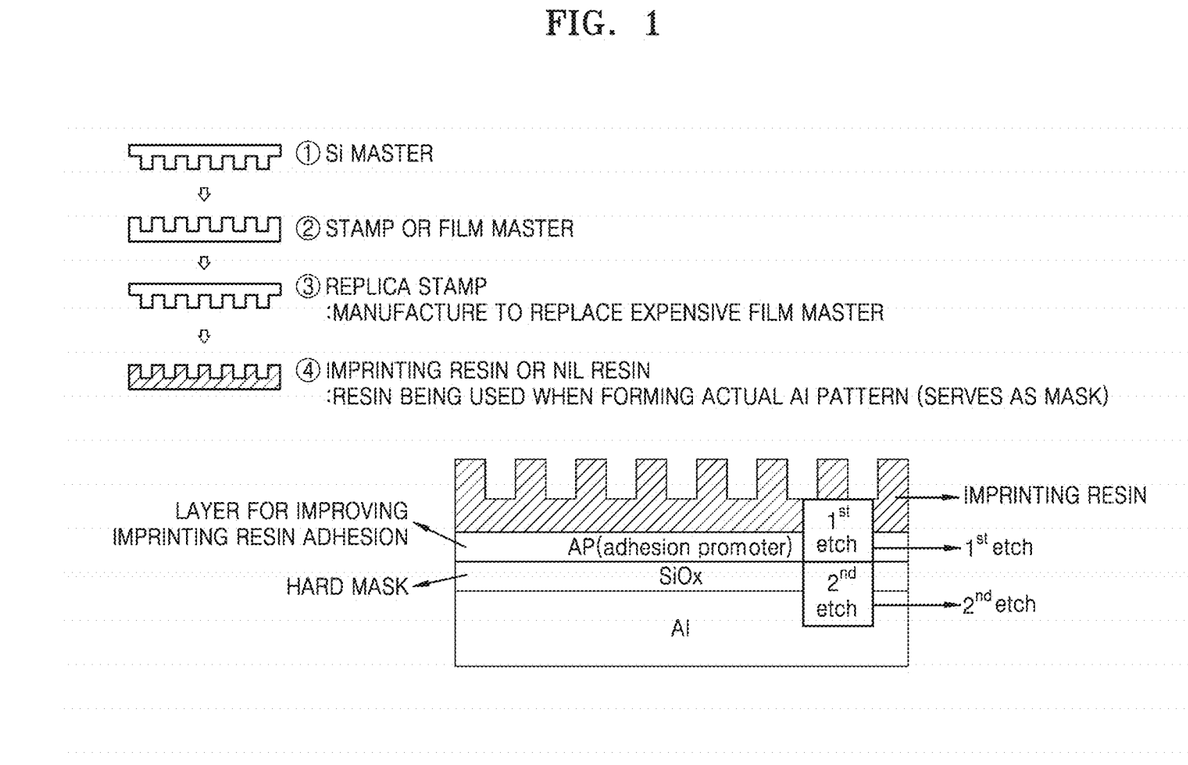
FIG. 1 is a schematic view that illustrates a nanoimprint lithography process using a patterned body according to an embodiment.
Figure 2:
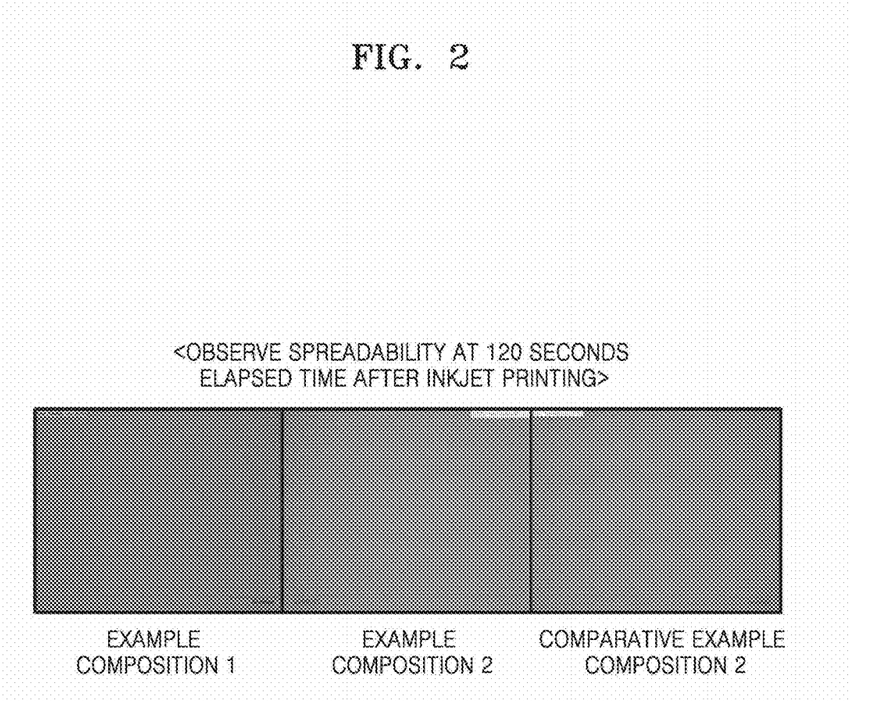
FIG. 2 and FIG. 3 show the results of evaluation of spreadibility of the patterned body according to an embodiment and a patterned body manufactured by using a comparative composition.
Figure 3:
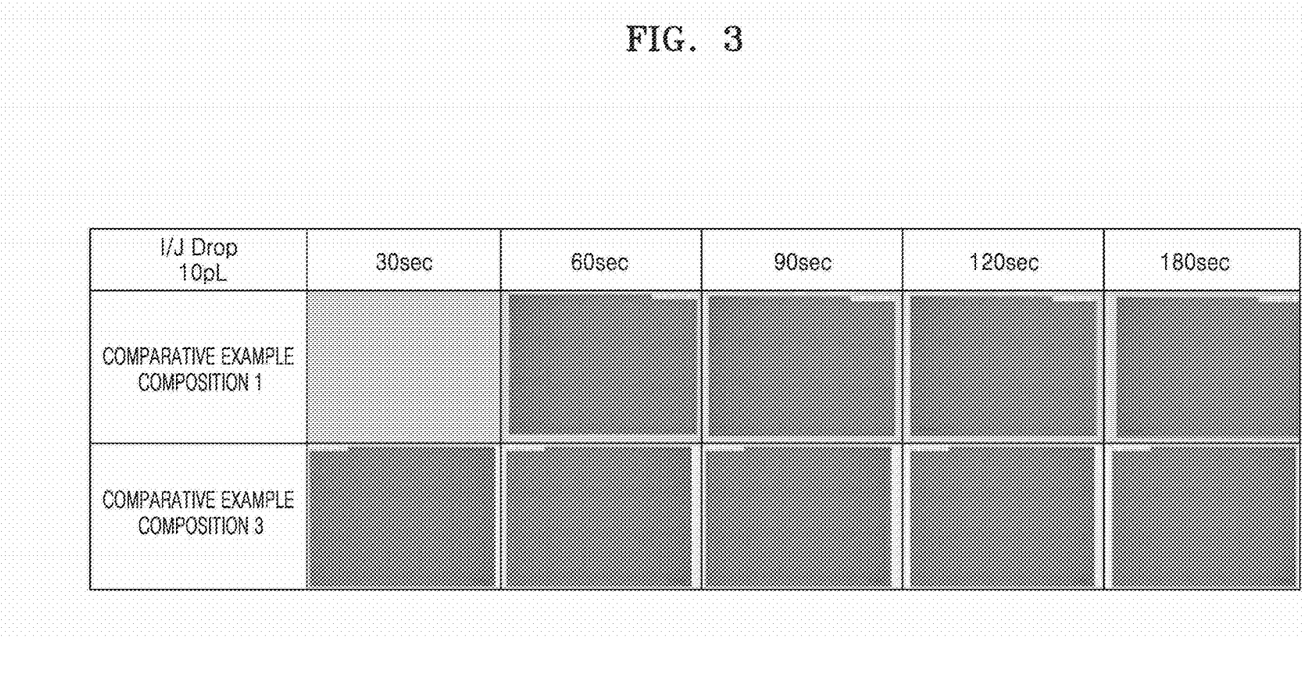

FIG. 2 is an image of Example Compositions 1 and 2 and Comparative Example Composition 2. Also, FIG. 3 is an image that shows observation of spreadabilities of Comparative Example Compositions 1 and 3 over time.

Evaluation Example 4: Evaluation of Releasing Force

Figure 4:
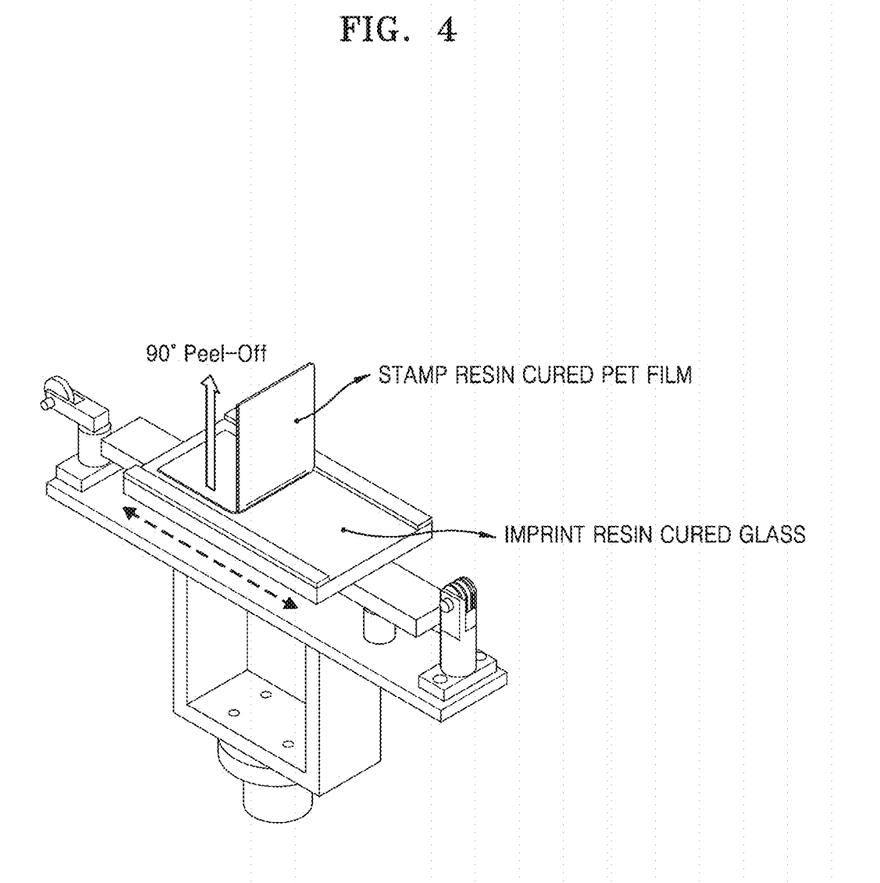
FIG. 4 shows a method of evaluating releasability of the patterned body according to an embodiment.

Example Composition 2 was coated on glass coated with an adhesion promoter, and the resultant was cured. A cured stamp film was laminated thereonto, and the resultant was exposed to light by using a UV lamp at an intensity of 2 J. Then, a releasing force thereof was evaluated by using a Peel-Off device shown in the schematic view in FIG. 4, and the measured releasing force was 0.035 kgf.

Evaluation Example 5: Observation of Paring

Figure 5:
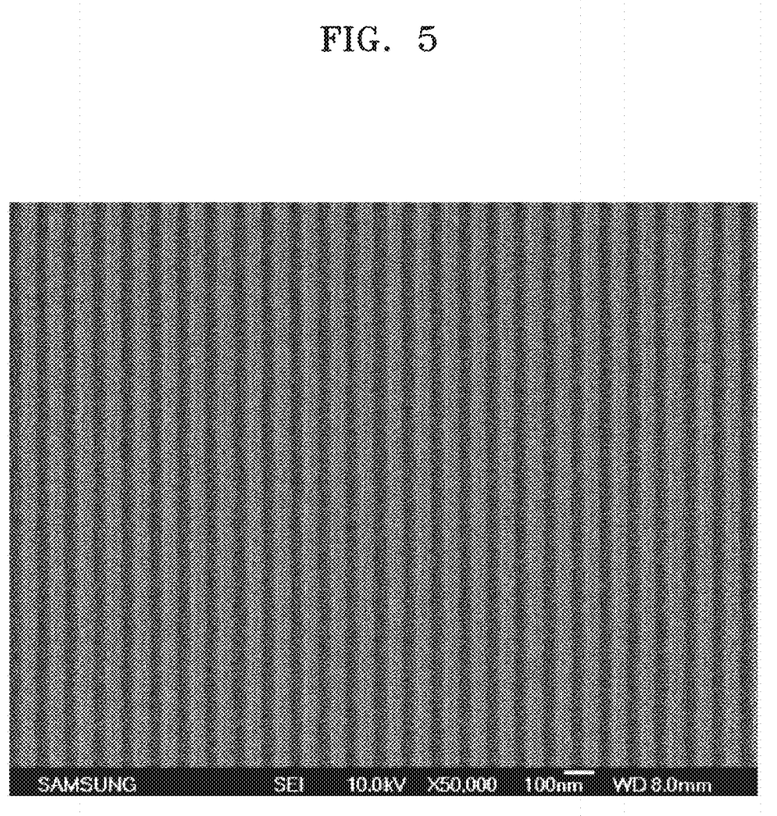
FIG. 5 shows the results of evaluation of paring of the patterned body according to an embodiment.
Figure 6:
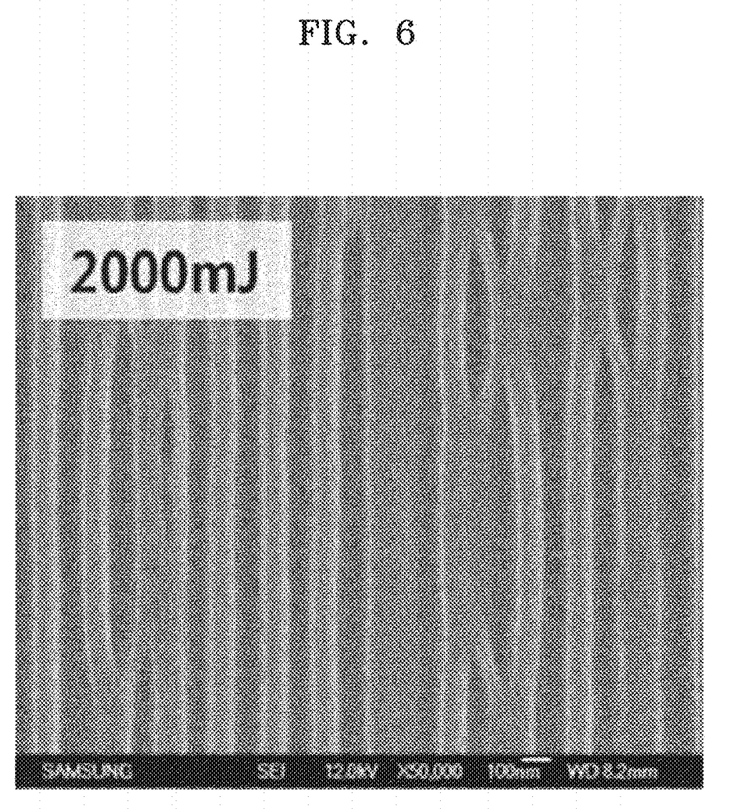
FIG. 6 shows a pattern in which paring phenomenon has occurred.

A patterned body was prepared by using Example Composition 2, and the patterned body was exposed to light by using a UV lamp at an intensity of 2 J to observe whether a paring phenomenon occurred or not, and the result is shown in FIG. 5. When the paring phenomenon occurred during formation of a pattern, a pattern having irregular shapes shown in FIG. 6 may be formed, but when Example Composition 2 according to an embodiment was used, a pattern having a regular shape shown in FIG. 5 was obtained.

Based on the evaluation result, it may be confirmed that the Example Compositions according to embodiments had physical properties such as a viscosity, a surface tension, a hardness, and an elastic modulus suitable for forming a patterned body, and the patterned body manufactured by using the Example Compositions did not generate a paring phenomenon while maintaining a low releasing force. In particular, Example Composition 2 had a low releasing force during a curing process and did not exhibit a paring phenomenon while having excellent spreadability, and thus it was confirmed that the composition according to an embodiment is appropriate for pattern formation.

As described above, according to one or more embodiments, the photocurable composition has physical properties such as a viscosity, a surface tension, a hardness, and an elastic modulus that are suitable for forming a patterned body. Also, since the patterned body manufactured by using the photocurable composition does not exhibit a paring phenomenon while maintaining a low releasing force, the photocurable composition may have excellent durability and may maintain accuracy of pattern formation at a high level.

It should be understood that embodiments described herein should be considered in a descriptive sense only and not for purposes of limitation. Descriptions of features or aspects within each embodiment should typically be considered as available for other similar features or aspects in other embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A photocurable composition, comprising:
   a fluorine-based polymeric monomer;
   a (meth)acrylate monomer; and
   a photoinitiator,
   wherein an amount of the fluorine-based polymeric monomer is in a range of about 20 parts to less than 40 parts by weight based on 100 parts by weight of the photocurable composition.

2. The photocurable composition of claim 1, wherein the fluorine-based polymeric monomer comprises a fluorine-containing (meth)acrylate.

3. The photocurable composition of claim 1, wherein the fluorine-based polymeric monomer comprises an acrylate represented by Formula 1:

Formula 1 wherein, in Formula 1,
$X_1$ is a single bond, O, S, —C(=O)—, or $C(R_{11})(R_{12})$,
$Y_1$ and $Y_2$ are each independently a single bond, O, S, or $C(R_{13})(R_{14})$,
$R_{f1}$ and $R_{f2}$ are each independently a $C_1$-$C_{20}$ hydrocarbon group comprising a fluorine atom,
$R_1$, $R_2$, $R_3$, $R_4$, $R_5$, $R_6$, $R_{11}$, $R_{12}$, $R_{13}$, and $R_{14}$ are each independently selected from:
   hydrogen, deuterium, —F, —Cl, —Br, —I, a $C_1$-$C_{20}$ alkyl group, a $C_2$-$C_{20}$ alkenyl group, a $C_2$-$C_{20}$ alkynyl group, and a $C_1$-$C_{20}$ alkoxy group; and
   a $C_1$-$C_{20}$ alkyl group, a $C_2$-$C_{20}$ alkenyl group, a $C_2$-$C_{20}$ alkynyl group, and a $C_1$-$C_{20}$ alkoxy group, each substituted with at least one selected from deuterium, —F, —Cl, —Br, —I, a hydroxyl group, a cyano group, an epoxy group, a nitro group, an amidino group, a hydrazino group, a hydrazono group, a $C_1$-$C_{20}$ alkyl group, and a $C_1$-$C_{20}$ alkoxy group, and
m1 is an integer selected from 1 to 10.

4. The photocurable composition of claim 2, wherein $R_{f1}$ and $R_{f2}$ are identical to each other and are each a $C_1$-$C_{20}$ hydrocarbon group comprising a fluorine atom.

5. The photocurable composition of claim 1, wherein the fluorine-based polymeric monomer comprises an acrylate represented by Formula 1-1:

Formula 1-1

6. The photocurable composition of claim 1, wherein an amount of the fluorine-based polymeric monomer is in a range of about 25 parts to about 35 parts by weight based on 100 parts by weight of the photocurable composition.

7. The photocurable composition of claim 1, wherein the (meth)acrylate monomer comprises a multifunctional (meth)acrylate monomer comprising at least three functional groups and a monofunctional (meth)acrylate monomer.

8. The photocurable composition of claim 7, wherein the multifunctional (meth)acrylate monomer comprising at least three functional groups comprises a tetrafunctional (meth)acrylate and a hexafunctional (meth)acrylate.

9. The photocurable composition of claim 7, wherein the multifunctional (meth)acrylate monomer comprising at least three functional groups comprises pentaerythritol tetra(meth)acrylate, dipentaerythritol tetra(meth)acrylate, ethoxylated pentaerythritol tetra(meth)acrylate, ethoxylated dipentaerythritol tetra(meth)acrylate, pentaerythritol hexa(meth)acrylate, dipentaerythritol hexa(meth)acrylate, or a combination thereof.

10. The photocurable composition of claim 7, wherein the monofunctional (meth)acrylate comprises polyethylene glycol phenylether (meth)acrylate, ethoxylated phenol (meth)acrylate, benzyl (meth)acrylate, tetrahydrofurfuryl (meth)acrylate, or a combination thereof.

11. The photocurable composition of claim 7, wherein an amount of the multifunctional (meth)acrylate monomer comprising at least three functional groups is in a range of about 1 part to about 20 parts by weight based on 100 parts by weight of the photocurable composition, and an amount of the monofunctional (meth)acrylate monomer is in a range of about 10 parts to about 60 parts by weight based on 100 parts by weight of the photocurable composition.

12. The photocurable composition of claim 7, further comprising a difunctional (meth)acrylate monomer.

13. The photocurable composition of claim 12, wherein the difunctional (meth)acrylate monomer comprises ethylene glycol di(meth)acrylate, diethylene glycol di(meth)acrylate, triethylene glycol di(meth)acrylate, propylene glycol di(meth)acrylate, dipropylene glycol di(meth)acrylate, or a combination thereof.

14. The photocurable composition of claim 12, wherein an amount of the difunctional (meth)acrylate monomer is in a range of about 10 parts to about 40 parts by weight based on 100 parts by weight of the photocurable composition.

15. The photocurable composition of claim 1, further comprising a releasing additive comprising a fluorine atom or a silicon atom.

16. The photocurable composition of claim 15, wherein an amount of the releasing additive is in a range of about 0.5 parts to about 5 parts by weight based on 100 parts by weight of the photocurable composition.

17. The photocurable composition of claim 1, wherein the photoinitiator is at least one selected from the group consisting of a phenyl ketone-based compound, and a phosphine oxide-based compound.

18. The photocurable composition of claim 1, wherein a viscosity of the photocurable composition at 25° C. is in a range of about 15 cps to 20 cps.

19. The photocurable composition of claim 1, wherein a surface tension of the photocurable composition at 25° C. is in a range of about 25 mN/m to 30 mN/m.

20. A patterned body manufactured by using the photocurable composition of claim 1.

* * * * *